United States Patent
Sugasawara et al.

[11] Patent Number: 6,083,848
[45] Date of Patent: Jul. 4, 2000

[54] REMOVING SOLDER FROM INTEGRATED CIRCUITS FOR FAILURE ANALYSIS

[75] Inventors: Emery Sugasawara, Pleasanton; Kevin Weaver, San Jose; Jay Hidy, Saratoga, all of Calif.

[73] Assignee: LSI Logic Corporation, Milpitas, Calif.

[21] Appl. No.: 09/052,884

[22] Filed: Mar. 31, 1998

[51] Int. Cl.[7] .............................. H01L 21/00; B08B 3/00; B08B 3/04; C23F 1/00
[52] U.S. Cl. .............................. 438/745; 134/1.2; 134/1.3
[58] Field of Search .............................. 438/745; 134/1.2, 134/1.3

[56] References Cited

U.S. PATENT DOCUMENTS

| | | | |
|---|---|---|---|
| 4,014,715 | 3/1977 | Preston | 134/3 |
| 4,773,940 | 9/1988 | Layher | 134/3 |
| 5,499,668 | 3/1996 | Katayama et al. | 134/1 |

*Primary Examiner*—Benjamin L. Utech
*Assistant Examiner*—Lynette T. Umez-Eronini

[57] ABSTRACT

A method for removing solder from the leads of ICs including immersing the IC in an acid solution. The acid solution dissolves the excess solder on the IC leads. The acid solution is preferably a hydrogen chloride solution containing about 38% hydrogen chloride and 62% water. The acid solution, however, can contain up to 50% hydrogen chloride. After the IC is immersed for a period of time, preferably ten minutes, it is removed from the acid solution and rinsed with water. The IC is rinsed so as to remove any remaining acid solution residue. Rinsing for 5 minutes or more typically ensures removing all of the acid solution. The IC is then inspected to determine whether substantially all of the excess solder is removed from the IC leads. If excess solder still remains on the IC leads, the IC is reintroduced into the solder removing process including immersing the IC in the acid solution, rinsing the IC with water, and inspecting the IC. The process is repeated until substantially all, if not all, of the excess solder is removed.

13 Claims, 3 Drawing Sheets

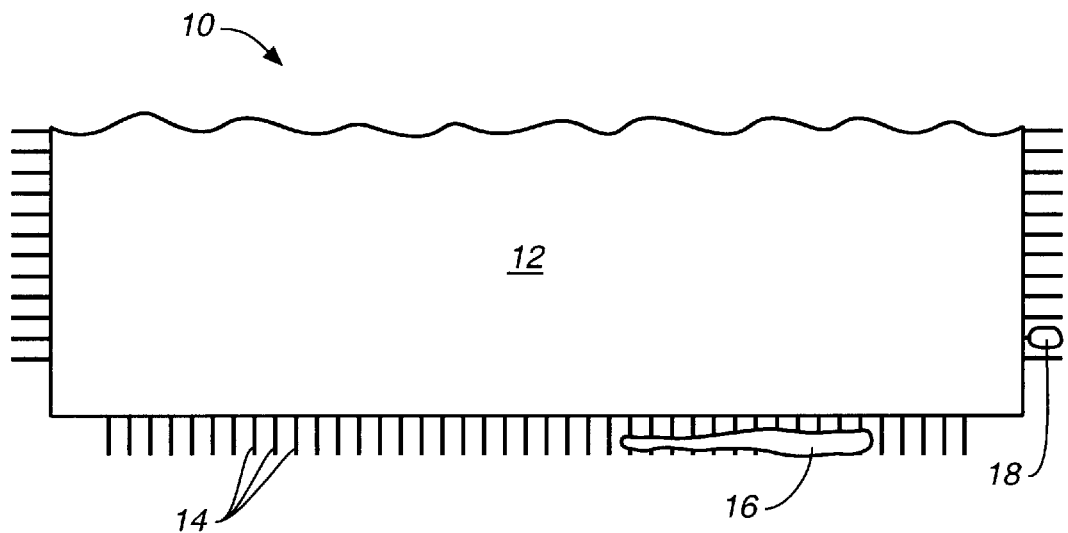
FIG._1A
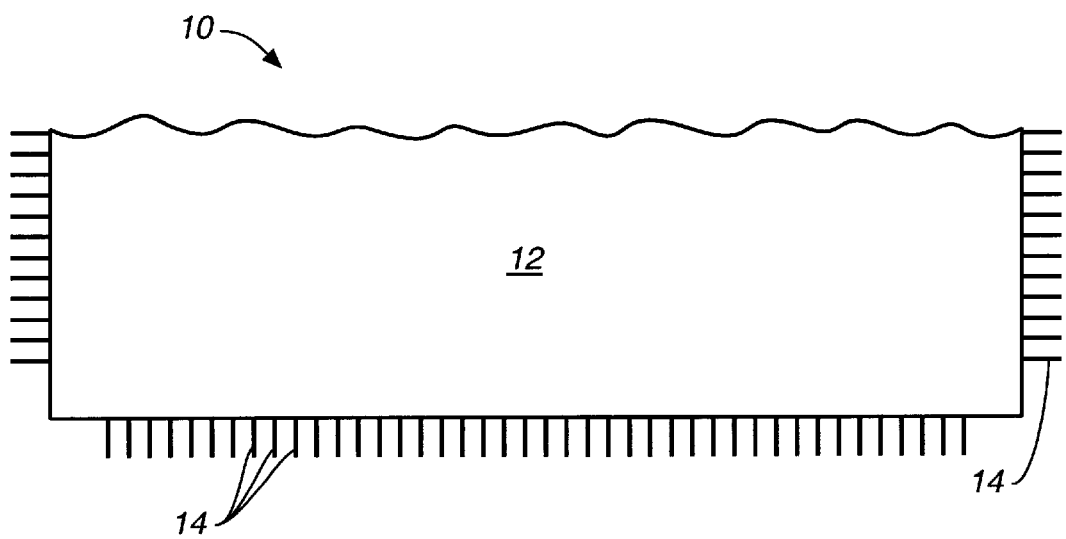
FIG._1B

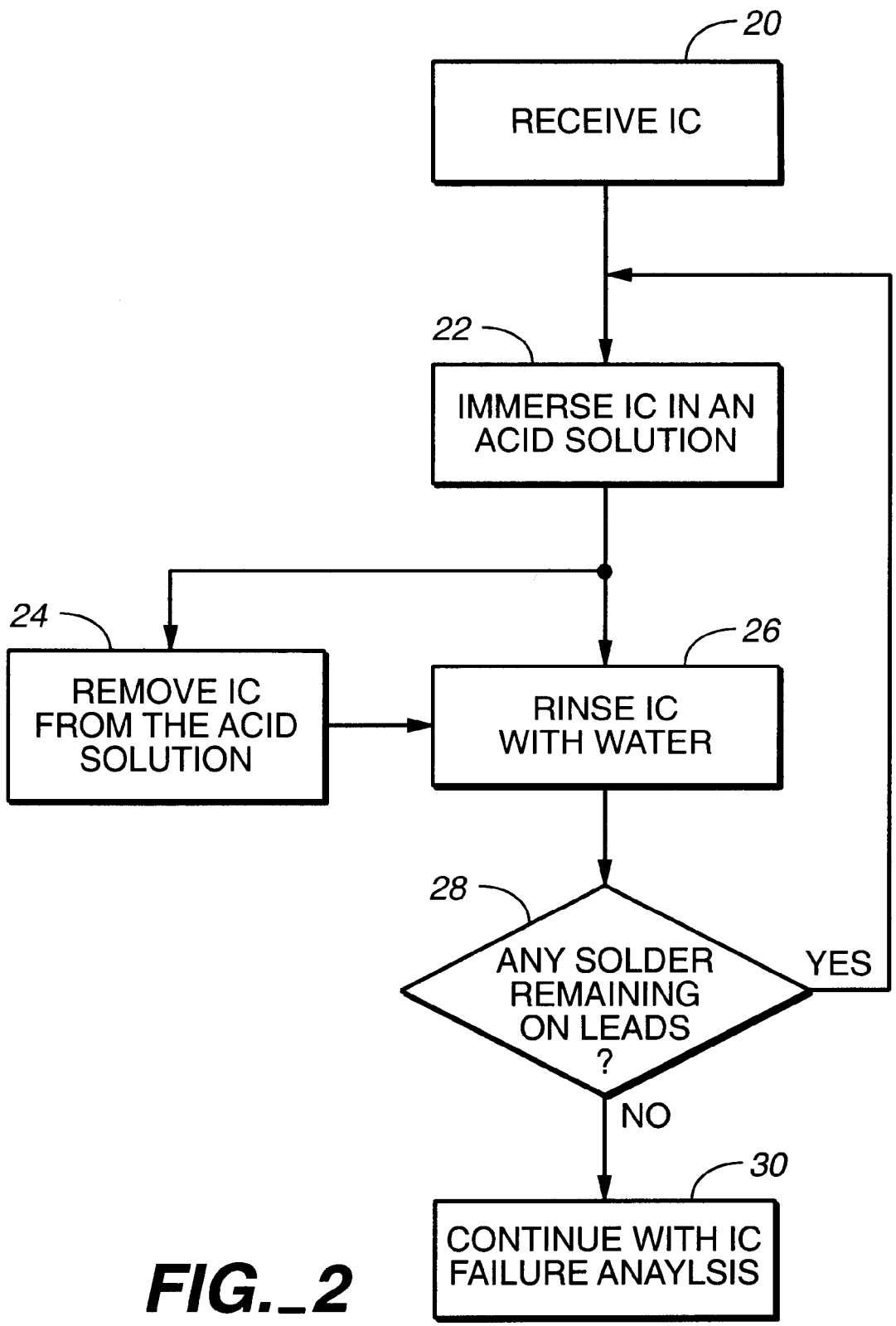
FIG._2

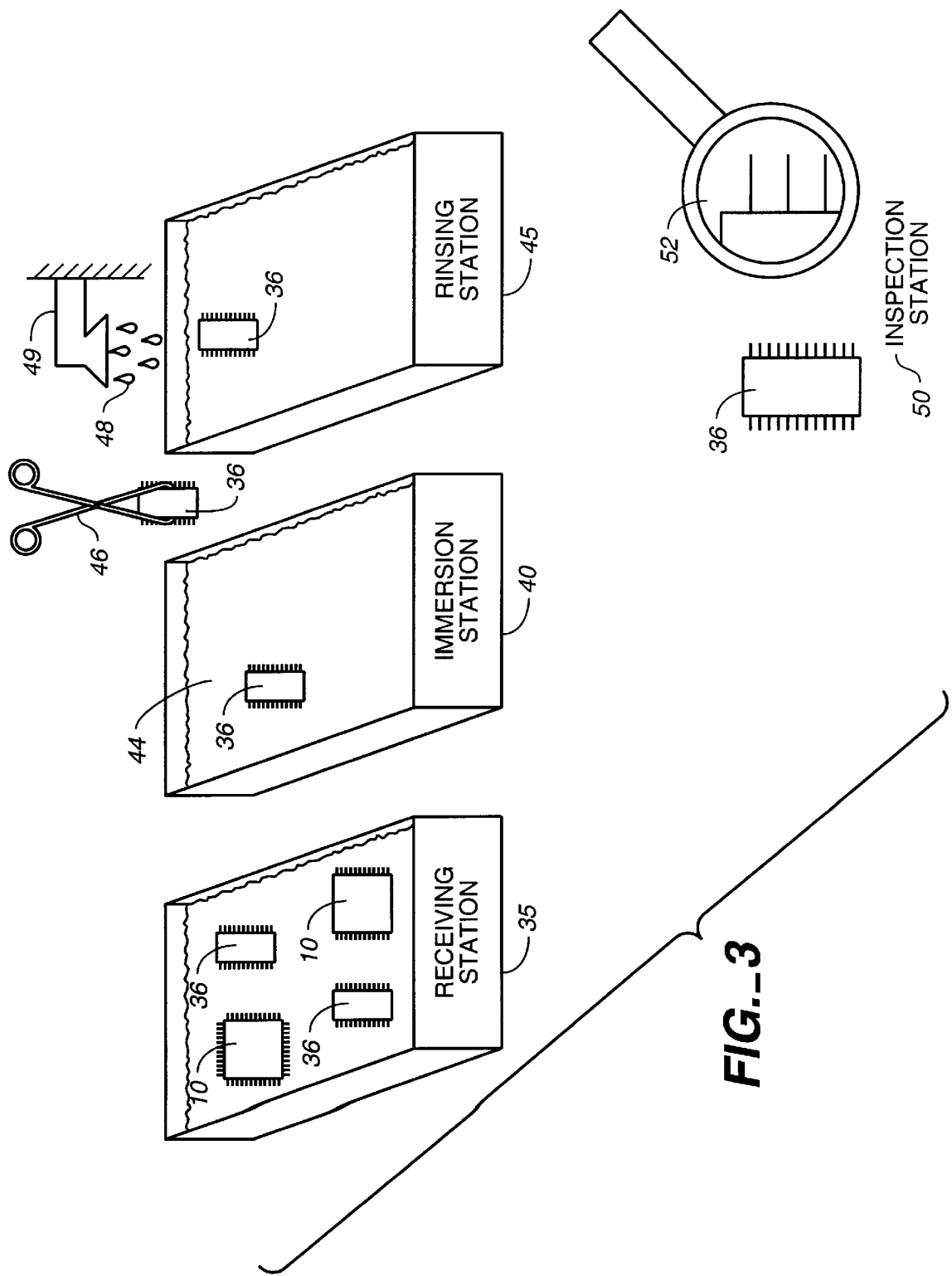

6,083,848

REMOVING SOLDER FROM INTEGRATED CIRCUITS FOR FAILURE ANALYSIS

The present invention relates to semiconductor integrated circuit failure analysis, and more particularly, to a method and apparatus for removing solder from the leads of failed semiconductor integrated circuit devices.

BACKGROUND OF THE INVENTION

Semiconductor integrated circuit designs and manufacturing techniques continue to evolve. Great progress has been made over the past generation in all phases of integrated circuit manufacturing to improve reliability of the finished products. Reliability of integrated circuits is of paramount importance to all concerned: the manufacturer, the OEM customer, and the end user. Indeed, in some "mission critical" applications, such as medicine or extra terrestrial applications, reliability of such circuits can be a matter of life and death. Even in more pedestrian applications, circuit failures lead to wasted time and expense, not to mention erosion of the manufacturer's reputation.

Although, in general, reliability of integrated circuits has become very high, the relentless push toward higher levels of integration, while maintaining high levels of reliability, presents an ongoing challenge. Part of the integrated circuit manufacturer's quest to improve reliability involves failure analysis—the analysis of failed parts in order to determine what caused the failure. Most manufacturers have extensive failure analysis departments, staffed by technicians, engineers, and other professionals who are skilled in this specialty.

Traditional methods of failure analysis include the following: applying selected voltages to circuit inputs and examining selected output voltage levels, either through the use of a functional tester, mechanical probing system, or the use of an electron beam detection system. Another known method of failure analysis is to apply selected voltages at certain pins and measure the current that the integrated circuit ("IC") draws in response. Another method involves applying selected currents at certain inputs and measuring the voltage levels or applying selected voltages to predetermined pins and looking for "hot stops" on the IC through either emission microscopy or infrared detection systems.

ICs fail in a variety of modes and for a variety of reasons. Many times, the IC does not fail until after it has been mounted on a printed circuit board ("PCB"). When the IC fails in this manner, the customer typically removes and replaces the IC from the PCB before sending the failed IC back to the manufacturer for failure analysis. To detach the IC from the PCB, the solder used to attach the failed IC to the PCB is heated and removed. This process often leaves excess solder on the leads of the failed IC.

The excess solder left on the leads of the failed IC must be removed before the IC is tested. Excess solder on the leads of the IC can cause adjacent leads to short which can lead to erroneous failure data and permanent damage to test equipment such as functional testers. Excess solder can also cause intermittent failures by intermittently shorting adjacent leads together. Intermittent failures are often difficult to detect and thus, time consuming, because they depend not only on the electrical signals being applied to the IC but also on the mechanical forces which cause the excess solder on adjacent leads to touch, intermittently shorting together. Excess solder also prevents failed ICs from being received into the IC sockets used in some test equipment, including functional testers. Current IC package technologies have leads that are extremely close together and the IC socket which receives the failed IC has equally close lead connections. Introducing failed ICs having excess solder on the leads into sockets often results in bending the relatively fragile IC leads.

Excess solder is ordinarily removed from the leads of ICs using a soldering iron and a "solder suck". The soldering iron is a manual device having a heated metal tip which melts or softens the excess solder when it is touched to the leads of the ICs. The solder suck is another manual device which creates an air vacuum that removes or "sucks" the melted or softened solder off the leads.

A primary disadvantage or limitation of removing excess solder in this manner is that it is time consuming. To avoid damaging the IC, excess solder must be removed generally from one lead at a time. Often, a single heat-and-suck cycle is insufficient to remove all of the excess solder requiring the technician to repeat the process many times.

In addition, removing solder using a soldering iron and a solder suck can result in damage to the IC. The technician generally holds the soldering iron in one hand and the solder suck in the other hand because the solder must be removed while it is still in a melted or molten state. This process requires excellent hand to eye coordination to heat the solder a sufficient amount of time quickly followed by activating the vacuum action of the solder suck to remove the excess solder. If the soldering iron is left on the lead for a longer than necessary time to melt the excess solder, the heat can damage the internal circuitry of the IC. Also, the solder suck vacuum action must be activated at the right time. If the solder is not sufficiently melted when the solder suck is activated, the solder will not depart the lead.

The leads of an IC can also bend when soldering irons and solder sucks having tips with diameters many times larger than the lead pitch of the ICs are applied incorrectly to the IC to remove the excess solder. Yet another problem with using a soldering iron and a solder suck to remove excess solder is that the technician may not be able to visually determine whether all of the excess solder is removed from the IC leads. This method of removing excess solder from the leads of failed ICs is thus time consuming and can itself introduce defects into the IC rendering the failure analysis suspect, if not useless.

Accordingly, it would be desirable to remove excess solder from ICs quickly, efficiently, and repeatably without damaging the IC. Additionally, it would be desirable to remove excess solder from ICs without the use of cumbersome solder removing tools like a soldering iron and a solder suck.

SUMMARY OF THE INVENTION

In view of the foregoing background summary, it is an object of the present invention to provide a method and apparatus for removing solder from the leads of ICs that overcomes the problems associated with prior art solder removing methods and tools.

Another object of the present invention is to provide a method and apparatus for removing solder from the leads of ICs which is quick, efficient, and repeatable.

A still further object of the present invention is to provide a method and apparatus for removing solder from the leads of ICs which is easy for technicians and other professionals to perform and use.

A further object of the present invention is to provide a method and apparatus for removing solder from the leads of ICs which does not result in damage to the ICs.

A still further object of the present invention is to provide a method and apparatus for removing solder from the leads of ICs which does not bend the leads of the ICs.

A still further object of the present invention is to provide a method and apparatus for removing solder from the leads of ICs which does not over heat the IC.

According to one aspect of the invention, a method for removing solder from the leads of ICs includes immersing the IC in an acid solution. The acid solution dissolves the excess solder on the IC leads. The acid solution is preferably a hydrogen chloride solution containing about 38% hydrogen chloride and 62% water. The acid solution, however, can contain up to 50% hydrogen chloride. After the IC is immersed for a period of time, preferably ten minutes, it is removed from the acid solution and rinsed with water. The IC is rinsed so as to remove any remaining acid solution residue. Rinsing for 5 minutes or more typically ensures removing all of the acid solution. The IC is then inspected to determine whether substantially all of the excess solder is removed from the IC leads. If excess solder still remains on the IC leads, the IC is reintroduced into the solder removing process including immersing the IC in the acid solution, rinsing the IC with water, and inspecting the IC. The process is repeated until substantially all, if not all, of the excess solder is removed.

Another aspect of the invention is an apparatus for removing solder from IC leads. The apparatus includes an acid solution and immersion means for containing the acid solution and for immersing the IC in the acid solution thereby dissolving solder from the IC leads. The acid solution is preferably a hydrogen chloride acid solution containing about 38% hydrogen chloride and 62% water. The acid solution, however, can contain up to 50% hydrogen chloride. The system also includes rinsing means for rinsing the IC after it has been immersed in the acid solution bath. The IC is preferably rinsed using deionized water.

The foregoing and other objects, features, and advantages of the invention will become more readily apparent from the following detailed description of a preferred embodiment which proceeds with reference to the drawings.

BRIEF DESCRIPTION OF THE DRAWINGS

FIG. 1A is a bottom view of an IC package having excess solder on its leads;

FIG. 1B is a partial bottom view of the IC shown in FIG. 1A after the excess solder has been removed from the leads using the method and apparatus of the present invention;

FIG. 2 is a flow chart of the solder removing method according to the present invention; and FIG. 3 is a block diagram of a solder removing apparatus utilizing the solder removing method according to the present invention.

DETAILED DESCRIPTION OF THE PREFERRED EMBODIMENT

ICs come in a variety of packages having a variety of types, shapes, sizes, and number of metal leads. Depending on the type, shape, and size of the package, the leads are arranged along the periphery of either two or four of the package sides. Additionally, the shape of the IC leads varies depending on whether the IC is a surface mount or through-hole device, among other things. Well known examples of IC packages include dual-in-line (DIP), small outline (SOP/SOIC), ceramic dual-in-line (CERDIP), small outline gull-wing (SOG), small outline "j"-lead (SOJ), plastic leaded-chip carrier (PLCC) packages, and so on. The present invention works well at removing solder off the leads of the variety of IC packages.

Referring to FIGS. 1A and 1B, an IC 10 includes and IC body 12 and a plurality of IC leads 14 arranged along the IC body 12 periphery. Many of the plurality of leads 14 shown in FIG. 1A are shorted together by excess solder glob 16. While excess solder 18 does not short two or more adjacent leads 14 together like solder glob 18, it does prevent the IC 10 from being received into a tester socket (not shown) during failure analysis. Thus, solder glob 16 and solder 18 must be removed from leads 14 before IC 10 is tested. FIG. 1B is a partial bottom view of the same IC 10 shown in FIG. 1A after solder 16 and 18 are removed using the solder removing method and apparatus according to the present invention.

FIG. 2 is a flow chart of the method for removing solder according to the present invention. FIG. 3 is a plan view of the apparatus for implementing the method for removing solder shown in FIG. 2. At step 20, the failed ICs 10 and 36 are received to receiving station 35 from a variety of sources. These sources can include the manufacturer 37, the OEM customer 38, and the end user 39. The ICs received at step 20 to receiving station 35 can have the variety of packages described above, including the quad SOJ package IC 10 and the DIP package IC 36.

At step 22, the IC 36 is provided to immersion station 40 where the IC 36 is immersed into an acid solution 44 contained in acid solution container 42. The acid solution 44 must cover the solder 16. However, it is not necessary, although possible, to fully submerse IC 36 in acid solution 44. The acid solution 44 is preferably a hydrochloride acid solution containing about 38% hydrogen chloride and 62% water. The acid solution, however, works well at dissolving excess solder 16 away from IC leads 14 when the acid solution 44 contains up to 50% hydrogen chloride.

The IC 36 is immersed into the acid solution 44 for a period of time sufficient to dissolve the excess solder 16 away from the IC leads 14. Immersing the IC 36 for ten minutes or more is usually sufficient to dissolve substantially all of the excess solder 16. However, as will be explained further below, if excess solder 16 remains after IC 36 has been once immersed in acid solution 44, the IC 36 may be immersed into the acid solution 44 as many times as required to substantially removed all of the remaining solder 16.

At step 24, the IC 36 is removed from acid solution 44 using removing means 36 after the requisite period of time has lapsed. The IC 36 is then transferred from immersion station 40 to rinsing station 45. At step 26, the IC 36 is rinsed with water 48 to remove any remaining acid solution 44 residue. Preferably, the IC 36 should be rinsed for about five minutes to ensure that the acid solution is completely removed. Additionally, it is preferable to rinse IC 36 using deionized water to prevent the introduction of random contaminants into the silicon surface of the die (not shown) internal to the IC 36. Deionized water is extremely low, if not completely devoid of ionic species such as metals in solution and halogens which are extremely reactive with materials such as silicon. Although the silicon die is sealed within the body 12 of the IC 36, random contaminants from non-deionized water can find its way to the silicon die and cause the IC 36 to fail or otherwise affect its operating characteristics.

After the IC 36 is rinsed in rinsing station 45, the IC 36 is inspected at inspection station 50. The IC is inspected using any of a number of inspection means 52 available to failure analysis professionals. For example, inspections means 52 can be the naked eye, a magnifying loop as shown in FIG. 3, a microscope, and the like.

The IC 36 is inspected to determine whether excess solder 16 remains on the leads 14 (step 28). If excess solder 16 remains on leads 14, the IC 36 can be re-imnmersed into acid solution 44 at immersion station 40 (step 22), removed from immersion station 40 (step 24), and rinsed with water 48 at rinsing station 45. The steps of immersing 22, removing 24, rinsing 26, and inspecting 28 are repeated until substantially all, if not all, of the excess solder 16 is removed from the leads 14 of the IC 36.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

I claim:

1. A method for removing solder from leads of an integrated circuit ("IC"), comprising:

immersing the IC in a hydrochloric acid solution until the solder dissolves;

removing the IC from the acid solution;

rinsing the IC with deionized water until all of the hydrochloric acid solution is removed from the IC;

determining whether there is any remaining solder on the IC leads; and repeating the steps of immersing, removing, and rinsing until substantially all of the solder is removed from the IC leads.

2. The method for removing solder of claim 1 wherein immersing the IC in an acid solution includes immersing the IC in an acid solution containing up to 50% hydrogen chloride.

3. The method for removing solder of claim 1 wherein immersing the IC in an acid solution includes immersing the IC in an acid solution containing about 38% hydrogen chloride.

4. The method for removing solder of claim 1 wherein immersing the IC in an acid solution includes immersing the IC in the acid solution for about 10 minutes.

5. The method for removing solder of claim 1 wherein rinsing the IC includes rinsing the IC with water for about 5 minutes.

6. The method for removing solder of claim 1 wherein rinsing the IC includes removing all of the acid solution from the IC.

7. The method for removing solder of claim 1 wherein determining whether there is any remaining solder on the IC leads includes inspecting the IC with the naked eye.

8. The method for removing solder of claim 1 wherein determining whether there is any remaining solder on the IC leads includes inspecting the IC with a magnifying loop.

9. The method for removing solder of claim 1 wherein determining whether there is any remaining solder on the IC leads includes inspecting the IC with a microscope.

10. A method for removing solder from integrated circuit ("IC") leads, comprising:

immersing the IC into a hydrochloric acid solution containing about 38% hydrogen chloride;

rinsing the IC with deionized water;

inspecting the rinsed IC to determine whether any solder remains on the IC leads; and repeating the immersing, removing, and rinsing steps if solder remains on the IC leads.

11. The method for removing solder of claim 10 wherein inspecting the rinsed IC includes inspecting the IC with the naked eye.

12. The method for removing solder of claim 10 wherein inspecting the rinsed IC includes inspecting the IC with a magnifying loop.

13. The method for removing solder of claim 10 wherein inspecting the rinsed IC includes inspecting the IC with a microscope.

* * * * *